(12) United States Patent
Du

(10) Patent No.: US 11,935,244 B2
(45) Date of Patent: Mar. 19, 2024

(54) METHOD AND APPARATUS FOR IMPROVING SENSITIVITY OF WAFER DETECTION, AND STORAGE MEDIUM

(71) Applicant: CHANGXIN MEMORY TECHNOLOGIES, INC., Hefei (CN)

(72) Inventor: Ran Du, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 411 days.

(21) Appl. No.: 17/389,709

(22) Filed: Jul. 30, 2021

(65) Prior Publication Data

US 2022/0138953 A1    May 5, 2022

Related U.S. Application Data

(63) Continuation of application No. PCT/CN2021/095592, filed on May 24, 2021.

(30) Foreign Application Priority Data

Oct. 29, 2020  (CN) .......................... 202011177610.0

(51) Int. Cl.
| G06T 7/11 | (2017.01) |
| G06T 7/00 | (2017.01) |
| G06T 7/73 | (2017.01) |
| H01L 21/66 | (2006.01) |

(52) U.S. Cl.
CPC .............. *G06T 7/11* (2017.01); *G06T 7/0004* (2013.01); *G06T 7/001* (2013.01); *G06T 7/74* (2017.01); *H01L 22/12* (2013.01); *G06T 2207/10056* (2013.01); *G06T 2207/30148* (2013.01); *H01L 22/20* (2013.01)

(58) Field of Classification Search
CPC ... G06T 7/11; G06T 7/001; G06T 7/74; G06T 2207/30148; G06T 2207/10056; G06T 7/0004; H01L 22/12; H01L 22/20
See application file for complete search history.

(56) References Cited

U.S. PATENT DOCUMENTS

| 2010/0079758 A1* | 4/2010 | Yoshikawa ............ G01N 21/21 356/369 |
| 2011/0298915 A1* | 12/2011 | Hiroi ....................... G06T 7/001 348/80 |
| 2014/0219544 A1* | 8/2014 | Wu ......................... H01L 22/34 382/149 |

FOREIGN PATENT DOCUMENTS

| CN | 101090083 A | 12/2007 |
| CN | 101751663 B | 3/2013 |
| CN | 109560000 A | 4/2019 |

(Continued)

*Primary Examiner* — Amandeep Saini
*Assistant Examiner* — Daniella M. DiGuglielmo
(74) *Attorney, Agent, or Firm* — Cooper Legal Group, LLC

(57) ABSTRACT

A method and apparatus for improving sensitivity of wafer detection, and a storage medium are provided. The method including: acquiring a gray-scale image of a peripheral circuit region of a wafer; dividing the gray-scale image into at least one pixel region; determining a repeated image region in each pixel region, in which the repeated image region is a region with N*M pixels where M pixels on a same column in the repeated image region have a same gray-scale value, and N and M are integers greater than 0; and determining position information where interference superposition occurs in the peripheral circuit region of the wafer according to all repeated image regions in the gray-scale image.

15 Claims, 5 Drawing Sheets

(56) References Cited

FOREIGN PATENT DOCUMENTS

| | | | |
|---|---|---|---|
| CN | 107580710 B | | 5/2019 |
| CN | 110132991 A | | 8/2019 |
| CN | 110867392 A | | 3/2020 |
| CN | 111403310 A | | 7/2020 |
| JP | H10135287 A | * | 5/1998 |
| JP | H10135287 A | | 5/1998 |
| KR | 20040110588 A | | 12/2004 |

* cited by examiner

METHOD AND APPARATUS FOR IMPROVING SENSITIVITY OF WAFER DETECTION, AND STORAGE MEDIUM

CROSS-REFERENCE TO RELATED APPLICATIONS

This is a continuation application of International Application No. PCT/CN2021/095592, filed on May 24, 2021, which claims priority to Chinese Patent Application No. 202011177610.0, filed on Oct. 29, 2020 to the State Intellectual Property Office of China and entitled "METHOD AND APPARATUS FOR IMPROVING SENSITIVITY OF WAFER DETECTION, AND STORAGE MEDIUM". The disclosures of International Application No. PCT/CN2021/095592 and Chinese Patent Application No. 202011177610.0 are hereby incorporated by reference in their entireties.

BACKGROUND

In wafer production processes, defects of a wafer usually need to be scanned and detected. At present, there are three kinds of scanning detection methods: dark-field scanning detection, bright-field scanning detection, and electronic scanning detection. In the dark-field scanning detection method, a surface of the wafer is irradiated with multiple light beams, and lights scattered from incidence points of all the light beams are collected and processed to determine a defect condition of the surface of the wafer.

SUMMARY

The present disclosure relates to technologies of semiconductor memory, and more particularly to a method and apparatus for improving sensitivity of wafer detection, and a storage medium.

According to a first aspect, the present disclosure discloses a method for improving sensitivity of wafer detection. The method includes the following operations.

A gray-scale image of a peripheral circuit region of a wafer is acquired.

The gray-scale image is divided into at least one pixel region.

A repeated image region in each pixel region is determined. The repeated image region is a region with N*M pixels, where M pixels on a same column in the repeated image region have a same gray-scale value, and N and M are integers greater than 0.

Position information where interference superposition occurs in the peripheral circuit region of the wafer is determined according to all repeated image regions in the gray-scale image.

According to a second aspect, the present disclosure discloses an apparatus for improving sensitivity of wafer detection. The apparatus includes memory for storing instructions, a transceiver and a processor. The processor is configured to execute the instructions stored in the memory to: acquire a gray-scale image of a peripheral circuit region of a wafer; divide the gray-scale image into at least one pixel region; determine a repeated image region in each pixel region, wherein the repeated image region is a region with N*M pixels, where M pixels on a same column in the repeated image region have a same gray-scale value, and N and M are integers greater than 0; and determine position information where interference superposition occurs in the peripheral circuit region of the wafer according to all repeated image regions in the gray-scale image.

According to a third aspect, the present disclosure discloses a non-transitory computer-readable storage medium. The computer-readable storage medium has stored thereon computer-executable instructions which, when being executed by a computer, cause the computer to execute the method for improving sensitivity of wafer detection as described in the first aspect.

DETAILED DESCRIPTION

Figure 1:
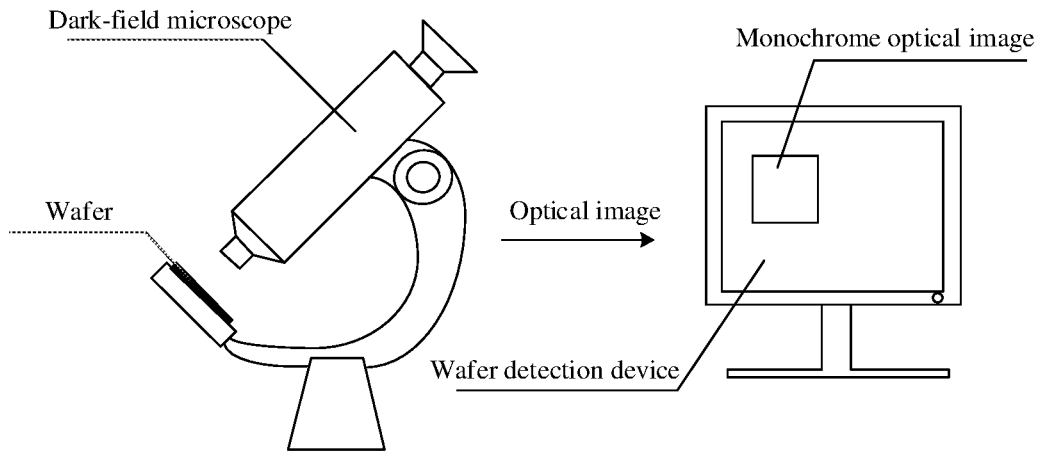
FIG. 1 is a schematic diagram of an application scenario of a method for improving sensitivity of wafer detection according to the disclosure.

A method for improving sensitivity of wafer detection in the present disclosure is applied to a wafer detection device. The wafer detection device may be a special purpose device, a special purpose computer, a personal computer, a server, etc. FIG. 1 is a schematic diagram of an application of a method for improving the sensitivity of wafer detection according to the disclosure. In this figure, the wafer detection device receives an optical image of a wafer sample acquired by a dark-field microscope. Then, the wafer detection device processes the optical image to obtain a monochrome optical image of a peripheral circuit region in the wafer sample. Then, the wafer detection device analyzes and processes the monochrome optical image to determine defect information of the peripheral circuit region of the wafer sample. The dark-field microscope may be replaced with other microscopes, for example, an optical microscope.

In wafer production processes, defects may be generated on a surface of the wafer due to chemical vapor deposition, optical development, chemical mechanical polishing, etc., therefore, the defects of the wafer are need to be scanned and detected. However, there are repeated image regions in a storage circuit region and peripheral circuit region of the wafer. Therefore, when the dark-field scanning is performed on the wafer, due to a principle of light interference, light waves may be superposed when light beams irradiate the repeated image regions, which may affect the defect detection of the surface of the wafer. Therefore, in order to eliminate the effect of light interference superposition, it is usually necessary to manually select the repeated image regions in the storage circuit region and the peripheral circuit region, and perform the Fourier analysis on these repeated image regions to determine positions where the light interference superposition occurs. Then the interference superposition is processed according to position information to obtain a result of the wafer defect detection. However, since a pattern of the peripheral circuit region is disordered, and the manually selected repeated image regions in the peripheral circuit region may have a large error. Therefore, the sensitivity of dark-field scanning detection is reduced and even a defect fatal to the wafer cannot be detected.

For this reason, the disclosure provides a method and apparatus for improving the sensitivity of wafer detection, and a storage medium. By analyzing gray-scale values of pixels in the monochrome optical image of the peripheral circuit region of the wafer sample, repeated image regions in the peripheral circuit region are determined, and then these repeated image regions are analyzed to determine defect information of the wafer sample.

Figure 2:
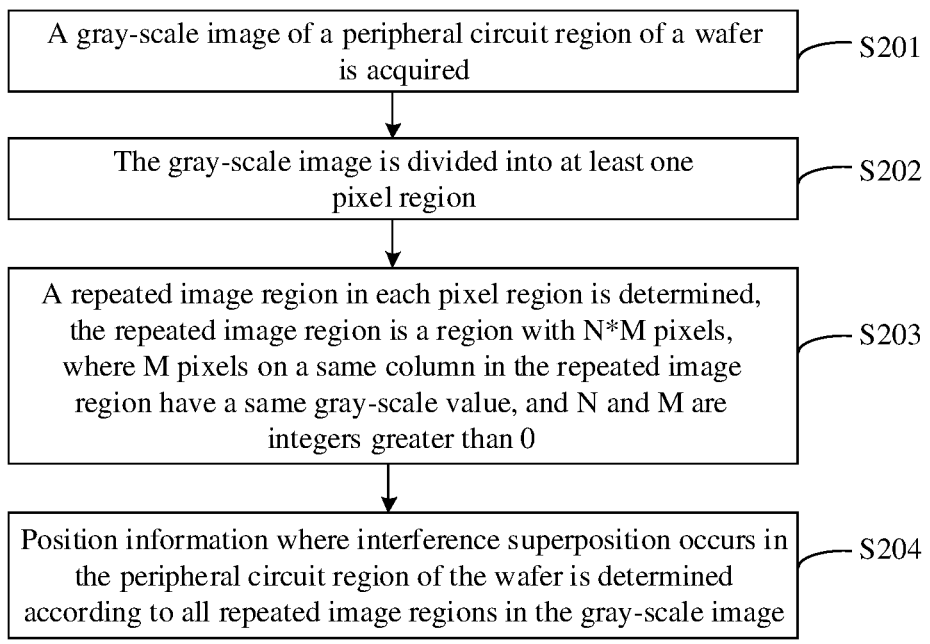
FIG. 2 is an exemplary flowchart of a method for improving sensitivity of wafer detection according to a first embodiment of the disclosure.

The technical solution of the disclosure and how the technical solution of the disclosure solves the foregoing technical problem will be described below in detail with specific embodiments. The following specific embodiments may be combined with each other. The same or similar concepts or processes will not be elaborated in some embodiments. The embodiments of the disclosure will be described below with reference to the drawings. Referring to FIG. 2, a first embodiment of the disclosure provides a method for improving sensitivity of wafer detection. The method for improving the sensitivity of wafer detection may be executed by a wafer detection device illustrated in FIG. 1, and the method for improving the sensitivity of wafer detection includes the following operations.

At S201, a gray-scale image of a peripheral circuit region of a wafer is acquired.

The gray-scale image is composed of many pixels, each of the pixels is marked with a gray-scale value which is determined by blackness and whiteness of the pixel. After acquiring an image of the wafer surface sent by a dark-field microscope, the wafer detection device converts the surface image into a monochrome image. Then, the wafer detection device converts the monochrome image into the gray-scale image.

At S202, the gray-scale image is divided into at least one pixel region.

The gray-scale image is analyzed in units of pixel regions. All the pixel regions in the gray-scale image should be distributed to ensure that all the pixels in the gray-scale image are analyzed. When the gray-scale image includes multiple pixel regions, the multiple pixel regions may have the same size or different sizes.

Figure 3:
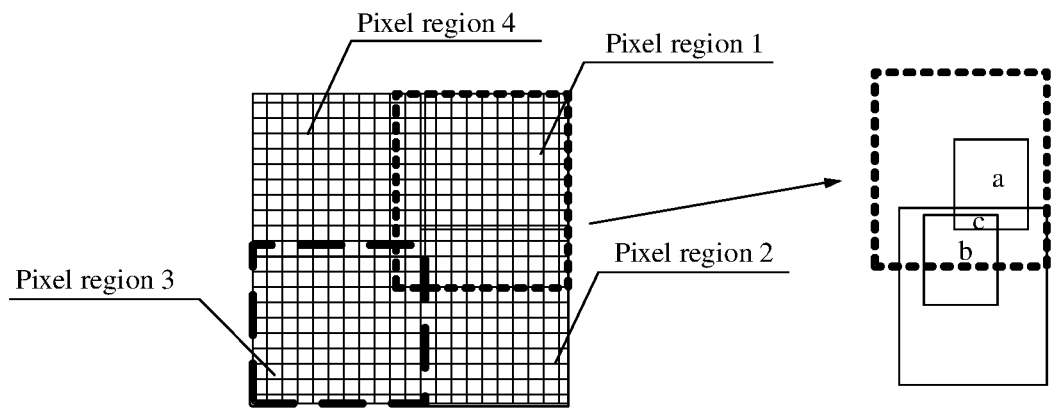
FIG. 3 is a schematic diagram of a gray-scale image according to an embodiment of the disclosure.
Figure 4:
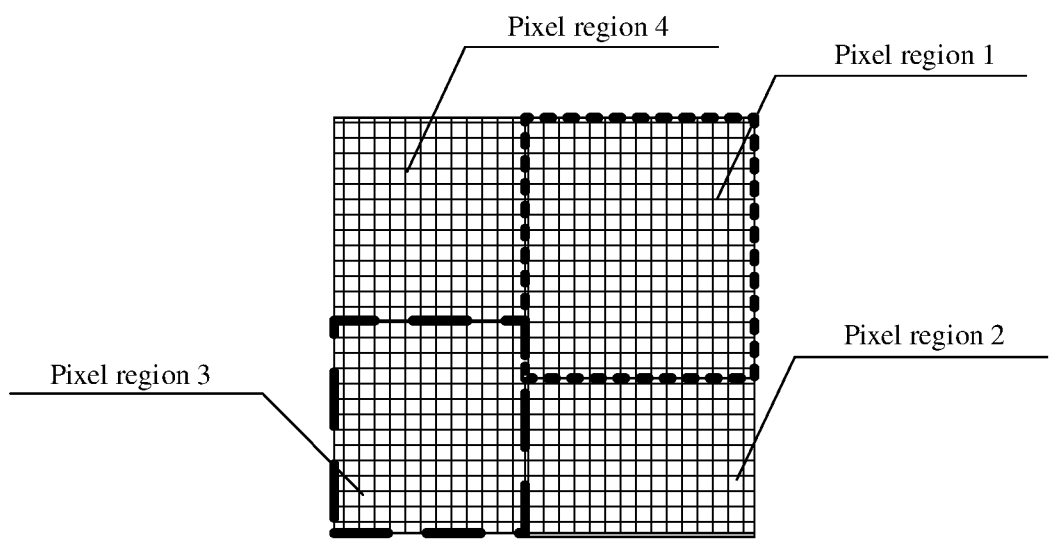
FIG. 4 is a schematic diagram of a gray-scale image according to another embodiment of the disclosure.

In an optional embodiment, when the gray-scale image includes multiple pixel regions, there may be region(s) overlapped between the multiple pixel regions. As illustrated in FIG. 3, the gray-scale image includes pixel region 1, pixel region 2, pixel region 3 and pixel region 4, and there are overlapped regions among the pixel region 1, pixel region 2, pixel region 3 and pixel region 4. In another optional embodiment, when the gray-scale image includes multiple pixel regions, there may be no overlapped region between the multiple pixel regions. As illustrated in FIG. 4, the gray-scale image is divided into pixel region 1, pixel region 2, pixel region 3 and pixel region 4, in which the pixel region 1, pixel region 2, pixel region 3, and pixel region 4 contact with one another.

Specifically, all of the pixel regions may have the same length and width or different lengths or widths. A size of the pixel region is represented as, for example, m*n, where m is the length of the pixel region, and n is the width of the pixel region. Values of m and n may be set according to a practical condition, and the values of m and n may be the same, or may be different. If m=10, and n=10, the pixel region is a pixel region with 10×10 pixels, and includes totally 100 pixels.

At S203, a repeated image region in each pixel region is determined, the repeated image region is a region with N*M pixels where M pixels on a same column in the repeated image region have a same gray-scale value, and N and M are integers greater than 0.

Figure 5:
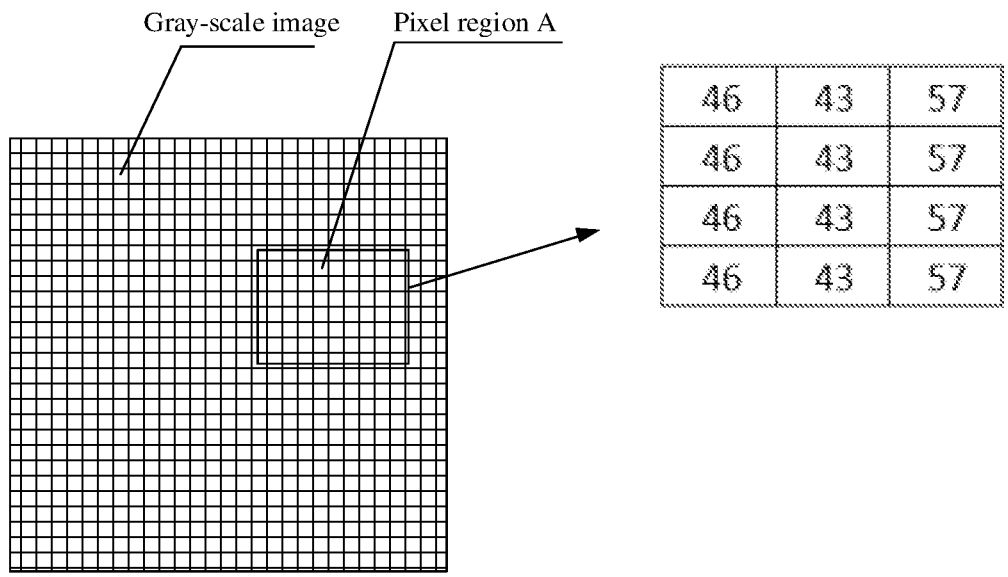
FIG. 5 is a schematic diagram of a repeated image region in a gray-scale image according to an embodiment of the disclosure.

For example, FIG. 5 illustrates a pixel region A, in which four continuous pixels with the same gray-scale value appear on each column of three continuous columns. In such case, an N*M pixels region in which N=3 and M=4 is determined as a repeated image region in pixel region A. In an optional embodiment, N and M are both more than or equal to 3. When the pixel regions in the gray-scale image are distributed in a manner illustrated in FIG. 3, there may be an overlapped region among the determined multiple repeated image regions in the gray-scale image. For example, as illustrated in FIG. 3, the pixel region 1 includes a repeated image region a, the pixel region 2 includes a repeated image region b, and there is an overlapped region c between the repeated image region a and the repeated image region b. When the pixel regions in the gray-scale image are distributed in a manner illustrated in FIG. 4, there is no overlapped region among the determined multiple repeated image regions in the gray-scale image.

At S204, position information where interference superposition occurs in the peripheral circuit region of the wafer is determined according to all repeated image regions in the gray-scale image.

In an optional embodiment, Fourier transform is performed on all the repeated image regions to determine the position information where the light interference superposition occurs in the peripheral circuit region, i.e., position information of an interference region located in the peripheral circuit region. After the position information where the interference superposition is located is determined by using Fourier analysis, the detection device arranges a light blocking strip on a physical position of a light path corresponding to the position information where the interference superposition is located. The light blocking strip may have a width of 1 mm or 4 mm. The light blocking strip can effectively block the light path where interference superposition occurs detected by the Fourier analysis, thereby avoiding the impact of interference superposition on the defect detection of the wafer in the dark-field. According to the solution, the sensitivity of dark-field scanning detection can be improved effectively, such that the defect of the wafer can be detected effectively, and the accuracy of the detection result can be improved.

According to the method for improving the sensitivity of wafer detection in the embodiment, the gray-scale image of the peripheral circuit region in the wafer is divided into the at least one pixel region, then the repeated image region with N*M pixels in each pixel region is determined, therein the gray-scale values of M pixels on the same column in the repeated image region are the same. Then all the repeated image regions in the gray-scale image are analyzed to determine the position information where the interference superposition occurs in the peripheral circuit region of the wafer. The method provided in the disclosure can determine the repeated image regions in the peripheral circuit region more accurately and comprehensively. Therefore, it is possible to solve the problem that the sensitivity of dark-field scanning detection is reduced and even a defect fatal to the wafer cannot be detected caused by the fact that the manually selected repeated image regions in the peripheral circuit region may have a large error, and the problem of the detection sensitivity reduction. According to the method provided in the disclosure, the sensitivity of dark-field scanning detection can be improved, such that the defect of the wafer can be detected effectively, and the detection efficiency can be improved.

Figure 6:
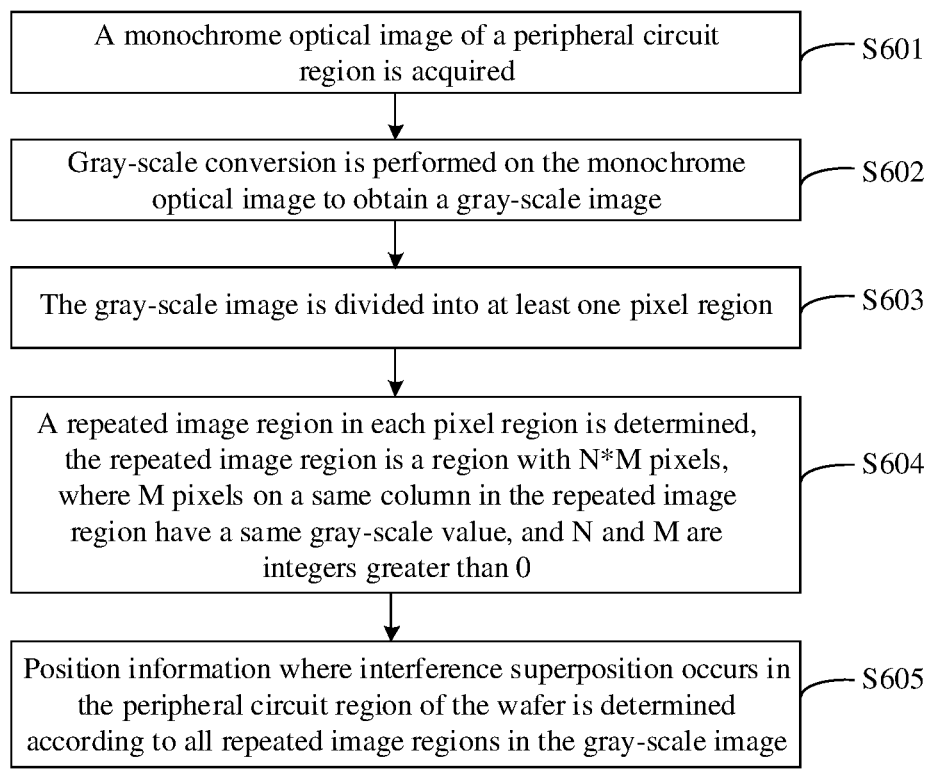
FIG. 6 is an exemplary flowchart of a method for improving sensitivity of wafer detection according to a second embodiment of the disclosure.

Referring to FIG. 6, a second embodiment of the disclosure provides a method for improving sensitivity of wafer detection. In the embodiment, a manner of acquisition of the gray-scale image of the peripheral circuit region in the wafer is mainly described. The method may be executed by the wafer detection device illustrated in FIG. 1, and includes the following operations.

At S601, a monochrome optical image of a peripheral circuit region is acquired.

The image is a color image before being converted into the monochrome optical image. The color image is acquired by a dark-field microscope and then sent to the wafer detection device. The wafer detection device may perform color conversion, i.e., monochrome processing, on the color image to generate the monochrome optical image.

At S602, gray-scale conversion is performed on the monochrome optical image to obtain a gray-scale image.

The gray-scale image is composed of pixels marked with gray-scale values. The gray-scale conversion refers to converting the monochrome optical image into the image composed of the pixels marked with the gray-scale values. In an optional embodiment, before S602, a saturation of the monochrome optical image may be adjusted to a preset saturation. The preset saturation may be set by a worker, or may be automatically generated by the wafer detection device. The monochrome optical image is adjusted to the preset saturation for a purpose that the wafer detection device can identify blackness and whiteness of the monochrome optical image effectively.

At S603, the gray-scale image is divided into at least one pixel region.

At S604, a repeated image region in each pixel region is determined, the repeated image region is a region with N*M pixels where M pixels on a same column in the repeated image region have a same gray-scale value, and N and M are integers greater than 0.

At S605, position information where interference superposition occurs in the peripheral circuit region of the wafer is determined according to all repeated image regions in the gray-scale image.

Specific implementation modes of S603 to S605 may refer to the related descriptions of S202 to S204 in the first embodiment, and will not be elaborated herein.

According to the method provided in the embodiment, the monochrome optical image may be adjusted to the preset saturation, such that the wafer detection device can identify blackness and whiteness of the monochrome optical image effectively. Then the gray-scale conversion is performed on the monochrome optical image to obtain the gray-scale image. In such way, the gray-scale value of each pixel in the gray-scale image may be displayed more accurately.

Figure 7:
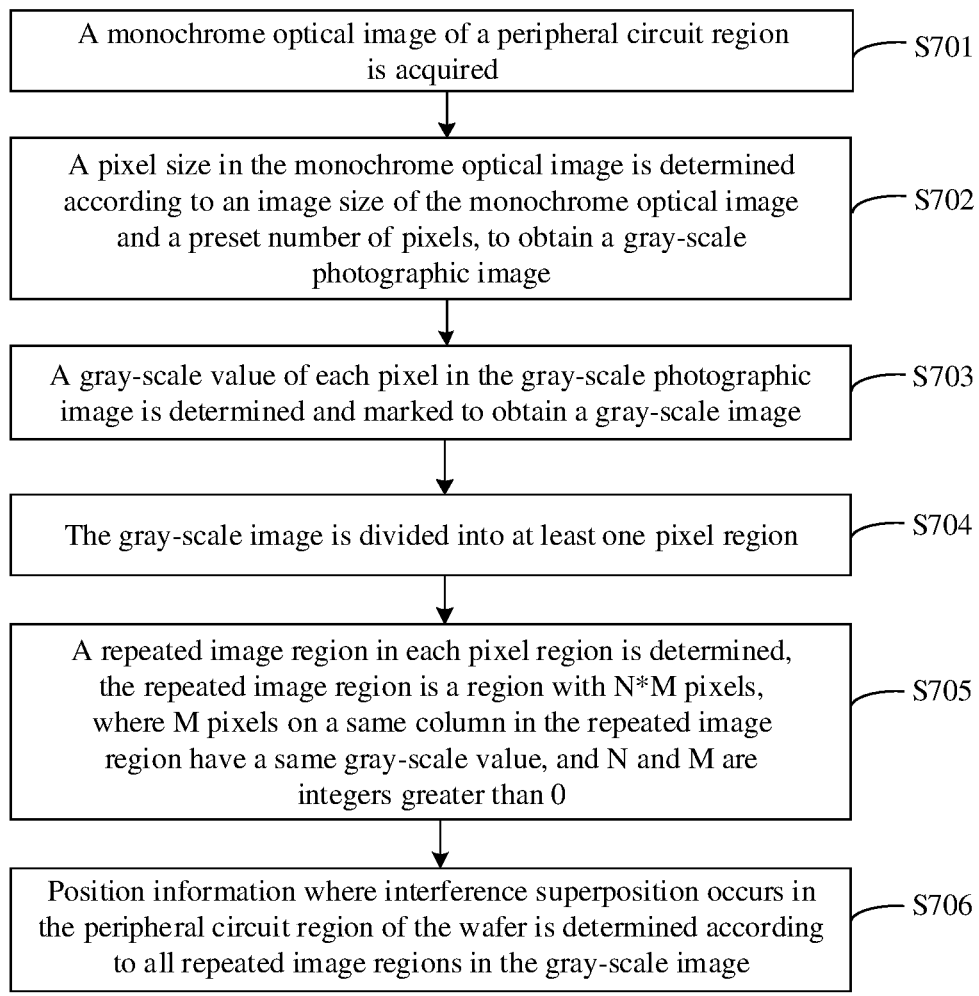
FIG. 7 is an exemplary flowchart of a method for improving sensitivity of wafer detection according to a third embodiment of the disclosure.

Referring to FIG. 7, a third embodiment of the disclosure provides a method for improving sensitivity of wafer detection. The method may be executed by the wafer detection device illustrated in FIG. 1, and includes the following operations.

At S701, a monochrome optical image of a peripheral circuit region is acquired.

A specific implementation mode of S701 may refer to the descriptions of S601 in the second embodiment, and will not be elaborated herein.

At S702, a pixel size in the monochrome optical image is determined according to an image size of the monochrome optical image and a preset number of pixels, to obtain a gray-scale photographic image.

The image size of the monochrome optical image is a physical size, for example, the monochrome optical image may be a perfectly circular image with a diameter of 3 centimeters, or the monochrome optical image may be a rectangular image with a length of 2 centimeters and a width of 1 centimeter. The preset number of pixels may be set by a worker according to actual requirements. In an optional embodiment, the preset number of pixels needs to be larger than 4,000. After obtaining the image size of the monochrome optical image and the preset number of pixels, the wafer detection device may determine the pixel size in the monochrome optical image through analysis, the pixel size may be, for example, 0.01 millimeters×0.01 millimeters. After the pixel size is determined, the gray-scale photographic image may be obtained. In other words, the monochrome optical image represented in a form of pixel is the gray-scale photographic image.

At S703, a gray-scale value of each pixel in the gray-scale photographic image is determined and marked to obtain a gray-scale image.

The wafer detection device may determine the gray-scale value of each pixel according to average blackness and whiteness of all the pixels. In an optional embodiment, the gray-scale value may range from 0 to 256. Then, the gray-scale value of each pixel in the gray-scale photographic image is marked to obtain the gray-scale image. Then, operations S202 to S204 are executed to determine the information of the position where the interference superposition occurs in the peripheral circuit region of the wafer.

At S704, the gray-scale image is divided into at least one pixel region.

At S705, a repeated image region in each pixel region is determined, the repeated image region is a region with N*M pixels where M pixels on a same column in the repeated image region have a same gray-scale value, and N and M are integers greater than 0.

At S706, position information where interference superposition occurs in the peripheral circuit region of the wafer is determined according to all repeated image regions in the gray-scale image.

Specific implementation modes of S704 to S706 may refer to the related descriptions of S202 to S204 in the first embodiment, and will not be elaborated herein.

Figure 8:
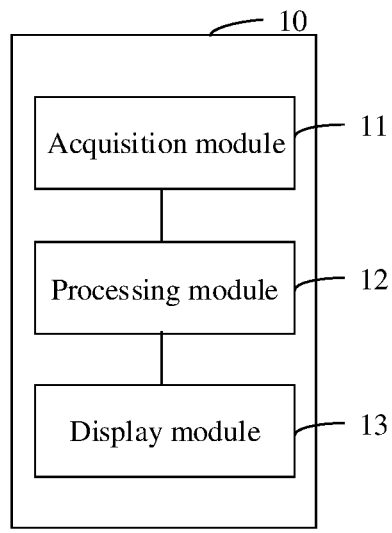
FIG. 8 is a schematic diagram of an apparatus for improving sensitivity of wafer detection according to a fourth embodiment of the disclosure.

Referring to FIG. 8, a fourth embodiment of the disclosure provides an apparatus for improving sensitivity of wafer detection. The apparatus 10 for improving the sensitivity of wafer detection includes an acquisition module 11 and a processing module 12.

The acquisition module 11 is configured to acquire a gray-scale image of a peripheral circuit region of a wafer.

The processing module 12 is configured to divide the gray-scale image into at least one pixel region.

The processing module 12 is further configured to determine a repeated image region in each pixel region, the repeated image region is a region with N*M pixels where M pixels on a same column in the repeated image region have a same gray-scale value, and N and M are integers greater than 0.

The processing module 12 is further configured to determine position information where interference superposition occurs in the peripheral circuit region of the wafer according to all repeated image regions in the gray-scale image.

The processing module 12 is specifically configured to acquire a monochrome optical image of the peripheral circuit region, and perform gray-scale conversion on the monochrome optical image to obtain the gray-scale image.

The processing module 12 is specifically configured to determine a pixel size in the monochrome optical image according to an image size of the monochrome optical image and a preset number of pixels, to obtain a gray-scale photographic image, and determine and mark a gray-scale value of each pixel in the gray-scale photographic image to obtain the gray-scale image.

The processing module 12 is further configured to adjust a saturation of the monochrome optical image to a preset saturation.

The apparatus 10 for improving the sensitivity of wafer detection further includes a display module 13. The display module 13 is configured to display the information of the position where the interference superposition occurs in the peripheral circuit region of the wafer.

Figure 9:
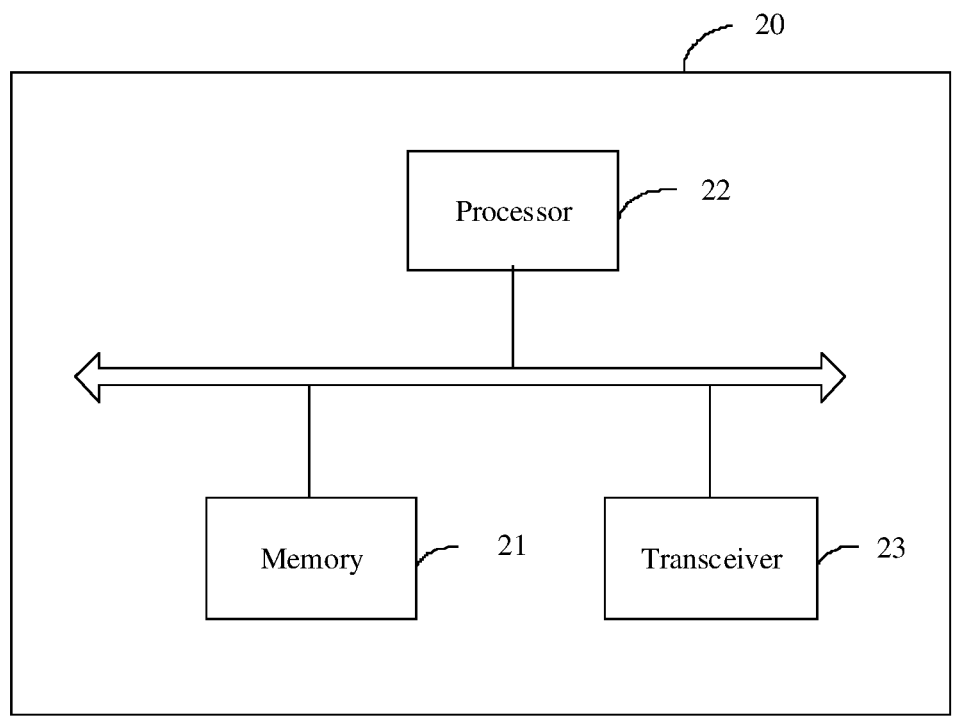
FIG. 9 is a schematic diagram of a wafer detection device according to an embodiment of the disclosure.

Referring to FIG. 9, an exemplary embodiment also provides a wafer detection device 20 including a memory 21, a processor 22 and a transceiver 23. The memory 21 is configured to store instructions. The transceiver 23 is configured to communicate with other devices. The processor 22 is configured to execute the instructions stored in the memory 21 to enable the wafer detection device 20 to execute the method for improving sensitivity of wafer detection in any one of the above embodiments.

In an exemplary embodiment, there is also provided a computer-readable storage medium having stored thereon computer-executable instructions which, when being executed by a computer, cause the computer to execute the method for improving sensitivity of wafer detection in any one of the above embodiments.

It is to be noted that the computer-readable storage medium may be a memory such as a Read Only Memory (ROM), a Programmable Read-Only Memory (PROM), an Erasable Programmable Read-Only Memory (EPROM), an Electrically Erasable Programmable Read-Only Memory (EEPROM), a Ferromagnetic Random Access Memory (FRAM), a flash memory, a magnetic surface memory, an optical disk, or a Compact Disc Read-Only Memory (CD-ROM), or may be various electronic devices including one or any combination of these memories, such as a mobile phone, a computer, a tablet device, and a personal digital assistant.

It is to be noted that terms "include" and "contain" or any other variant thereof is intended to cover nonexclusive inclusion herein. Therefore, a process, method, object, or apparatus including a series of elements not only includes those listed elements but also includes other elements which are not clearly listed, or further includes elements that are intrinsic to the process, the method, the object, or the apparatus. Without more limitations, an element defined by the statement "including a/an" does not exclude the same other elements in a process, method, object, or apparatus including the element.

The sequence numbers of the embodiments of the disclosure are not to represent a priority order of the embodiments but only for description.

From the above descriptions of the implementation modes, those skilled in the art would clearly understand that the method of the abovementioned embodiments may be implemented in a manner of combining software and a necessary universal hardware platform, and of course, may also be implemented through hardware, but the former is a preferred implementation mode under many circumstances. Based on such an understanding, the technical solution of the present disclosure substantially, or a part thereof making a contribution to the related art, may be embodied in form of software product, and the computer software product may be stored in a storage medium such as a ROM/Random Access Memory (RAM), a magnetic disk or an optical disk, and the computer software product includes a plurality of instructions configured to enable a computer device (e.g., a personal computer, a server, a conditioner, or a network device) to execute the method as described in various embodiments of the disclosure.

The disclosure is described with reference to flowcharts and/or block diagrams of the method, device (system), and computer program product according to the embodiments of the disclosure. It should be understood that each flow and/or block in the flowcharts and/or the block diagrams and combinations of flows and/or blocks in the flowcharts and/or the block diagrams may be implemented by computer program instructions. These computer program instructions may be provided for a universal computer, a dedicated computer, an embedded processor or a processor of other programmable data processing devices to generate a machine, so that a device for realizing a function specified in one flow or multiple flows in the flowcharts and/or one block or multiple blocks in the block diagrams is generated by the instructions executed through the computer or the processor of the other programmable data processing devices.

These computer program instructions may also be stored in a computer-readable memory capable of guiding the computer or the other programmable data processing devices to operate in a specific manner, so that a product including an instruction device may be generated by the instructions stored in the computer-readable memory, the instruction device realizing the function specified in one flow or multiple flows in the flowcharts and/or one block or multiple blocks in the block diagrams.

These computer program instructions may further be loaded onto the computer or the other programmable data processing devices, so that a series of operating steps are executed on the computer or the other programmable data processing devices to generate processing implemented by the computer, and steps for realizing the function specified in one flow or multiple flows in the flowcharts and/or one block or multiple blocks in the block diagrams are provided by the instructions executed on the computer or the other programmable data processing devices.

The above description is only the specific implementation mode of the disclosure and not intended to limit the scope of protection of the disclosure. Any variation or replacement apparent to those skilled in the art within the technical scope disclosed in the disclosure shall fall within the protection scope of the disclosure. Therefore, the protection scope of the disclosure shall be subject to the protection scope of the claims.

The invention claimed is:

1. A method for improving sensitivity of wafer detection, comprising:
   acquiring a gray-scale image of a peripheral circuit region of a wafer;

dividing the gray-scale image into at least one pixel region;
determining a repeated image region in each of the at least one pixel region, wherein the repeated image region is a region with N*M pixels, where M pixels on a same column in the repeated image region have a same gray-scale value, and N and M are integers greater than 0;
performing Fourier analysis on all repeated image regions in the gray-scale image to determine position information where interference superposition occurs in the peripheral circuit region of the wafer according to all the repeated image regions in the gray-scale image; and
processing the interference superposition according to the position information to obtain a wafer defect.

2. The method of claim 1, wherein acquiring the gray-scale image of the peripheral circuit region of the wafer comprises:
acquiring a monochrome optical image of the peripheral circuit region; and
performing gray-scale conversion on the monochrome optical image to obtain the gray-scale image.

3. The method of claim 2, wherein performing the gray-scale conversion on the monochrome optical image to obtain the gray-scale image comprises:
determining a pixel size in the monochrome optical image according to an image size of the monochrome optical image and a preset number of pixels, to obtain a gray-scale photographic image; and
determining and marking a gray-scale value of each pixel in the gray-scale photographic image to obtain the gray-scale image.

4. The method of claim 2, further comprising:
before performing the gray-scale conversion on the monochrome optical image to obtain the gray-scale image, adjusting a saturation of the monochrome optical image to a preset saturation.

5. The method of claim 1, further comprising:
displaying the position information where the interference superposition occurs in the peripheral circuit region of the wafer.

6. An apparatus for improving sensitivity of wafer detection, comprising:
memory for storing instructions;
a transceiver; and
a processor, wherein the processor is configured to execute the instructions stored in the memory to:
acquire a gray-scale image of a peripheral circuit region of a wafer;
divide the gray-scale image into at least one pixel region;
determine a repeated image region in each of the at least one pixel region, wherein the repeated image region is a region with N*M pixels, where M pixels on a same column in the repeated image region have a same gray-scale value, and N and M are integers greater than 0;
perform Fourier analysis on all repeated image regions in the gray-scale image to determine position information where interference superposition occurs in the peripheral circuit region of the wafer according to all the repeated image regions in the gray-scale image; and
process the interference superposition according to the position information to obtain a wafer defect.

7. The apparatus of claim 6, wherein the processor is specifically configured to:
acquire a monochrome optical image of the peripheral circuit region; and
perform gray-scale conversion on the monochrome optical image to obtain the gray-scale image.

8. The apparatus of claim 7, wherein the processor is specifically configured to:
determine a pixel size in the monochrome optical image according to an image size of the monochrome optical image and a preset number of pixels, to obtain a gray-scale photographic image; and
determine and mark a gray-scale value of each pixel in the gray-scale photographic image to obtain the gray-scale image.

9. The apparatus of claim 7, wherein the processor is further configured to:
adjust a saturation of the monochrome optical image to a preset saturation.

10. The apparatus of claim 6, further comprising:
a display circuitry, configured to display the position information where the interference superposition occurs in the peripheral circuit region of the wafer.

11. A non-transitory computer-readable storage medium having stored thereon computer-executable instructions which, when being executed by a computer, cause the computer to execute a method for improving sensitivity of wafer detection, the method comprising:
acquiring a gray-scale image of a peripheral circuit region of a wafer;
dividing the gray-scale image into at least one pixel region;
determining a repeated image region in each of the at least one pixel region, wherein the repeated image region is a region with N*M pixels, where M pixels on a same column in the repeated image region have a same gray-scale value, and N and M are integers greater than 0;
performing Fourier analysis on all repeated image regions in the gray-scale image to determine position information where interference superposition occurs in the peripheral circuit region of the wafer according to all the repeated image regions in the gray-scale image; and
processing the interference superposition according to the position information to obtain a wafer defect.

12. The non-transitory computer-readable storage medium of claim 11, wherein acquiring the gray-scale image of the peripheral circuit region of the wafer comprises:
acquiring a monochrome optical image of the peripheral circuit region; and
performing gray-scale conversion on the monochrome optical image to obtain the gray-scale image.

13. The non-transitory computer-readable storage medium of claim 12, wherein performing the gray-scale conversion on the monochrome optical image to obtain the gray-scale image comprises:
determining a pixel size in the monochrome optical image according to an image size of the monochrome optical image and a preset number of pixels, to obtain a gray-scale photographic image; and
determining and marking a gray-scale value of each pixel in the gray-scale photographic image to obtain the gray-scale image.

14. The non-transitory computer-readable storage medium of claim 12, wherein the method further comprises:
before performing the gray-scale conversion on the monochrome optical image to obtain the gray-scale image, adjusting a saturation of the monochrome optical image to a preset saturation.

15. The non-transitory computer-readable storage medium of claim 11, wherein the method further comprises:
displaying the position information where the interference superposition occurs in the peripheral circuit region of the wafer.

* * * * *